United States Patent
Hsu et al.

(10) Patent No.: US 6,908,818 B2
(45) Date of Patent: Jun. 21, 2005

(54) CONTACTLESS CHANNEL WRITE/ERASE FLASH MEMORY CELL AND ITS FABRICATION METHOD

(75) Inventors: Ching-Hsiang Hsu, Hsin-Chu (TW); Ching-Sung Yang, Chang-Hua Hsien (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 337 days.

(21) Appl. No.: 10/065,189

(22) Filed: Sep. 25, 2002

(65) Prior Publication Data

US 2003/0008451 A1 Jan. 9, 2003

Related U.S. Application Data

(62) Division of application No. 09/683,581, filed on Jan. 22, 2002, now Pat. No. 6,534,817.

(30) Foreign Application Priority Data

Feb. 20, 2001 (TW) .................................. 90103768 A

(51) Int. Cl.$^7$ ............................................ H01L 21/336
(52) U.S. Cl. ....................................... 438/266; 257/314
(58) Field of Search ............................... 438/201, 211, 438/257, 266, 593; 257/315, 316, 321–322, 324, 336, 344, 408

(56) References Cited

U.S. PATENT DOCUMENTS 5,424,567 A * 6/1995 Chen ........................... 257/315
5,936,887 A * 8/1999 Choi et al. .............. 365/185.17

* cited by examiner

Primary Examiner—David Nelms
Assistant Examiner—David Vu
(74) Attorney, Agent, or Firm—Winston Hsu

(57) ABSTRACT

A contactless channel write/erase flash memory cell structure and its fabricating method for increasing the level of integration is disclosed. The present invention utilizes a buried diffusion method to form an N$^+$-doped region that acts as a drain of the flash memory cell and a P-doped region underneath an oxide layer. The N$^+$-doped region and the P-doped region extend to in a bit line direction and a metal contact is used to connect the two away from any of the N$^+$-doped region and the P-doped region of the flash memory cell for decreasing the numbers of the metal contacts in the flash memory cell and reducing dimensions of the device.

6 Claims, 16 Drawing Sheets

CONTACTLESS CHANNEL WRITE/ERASE FLASH MEMORY CELL AND ITS FABRICATION METHOD

CROSS REFERENCE TO RELATED APPLICATIONS

This application is a division of application Ser. No. 09/683,581 filed on Jan. 22, 2002 U.S. Pat. No. 6,534,817.

BACKGROUND OF INVENTION

1. Field of the Invention

The present invention relates to the field of non-volatile memorys, and more particularly, to a contactless channel write/erase flash memory cell/array and method of fabricating the same.

2. Description of the Prior Art

FIG. 1 is a cross-sectional view illustrating a conventional flash memory cell 10. FIG. 2 is a cross-section view illustrating a metal contact structure associated with the conventional flash memory cell structure. Referring to FIG. 1, the flash memory cell 10 is built upon a P-substrate 11 including a N-well 12 formed on the P-substrate 11 and a stacked gate 14 formed on the N-well 12. An $N^+$-doped region 16 and an $N^+$-doped region 18, functioning as a source and a drain of the flash memory cell 10, respectively, are formed two sides of the stacked gate 14 in the N-well 12 respectively. A P-doped region 20 is formed surrounding the $N^+$-doped region 18 in the N-well 12 and a P-doped region 22 is formed beneath the stacked gate 14.

The stacked gate 14 includes a control gate 24 and a floating gate 26. A word line voltage $V_{WL}$ is applied to the control gate 24 for controlling the flash memory cell 10. The floating gate 26 is in a "floating" state without any direct connection with external circuits for storing charges. A source voltage $V_{SL}$ is applied to the $N^+$-doped region 16 (source terminal), and a drain voltage $V_{BL}$ is applied to the $N^+$-doped region 18 (drain terminal).

With these applied voltages, electrons ($e^-$) eject from the floating gate 26 to the $N^+$-doped region 18 due to the edge Fowler-Nordheim effect and the flash memory cell 10 is programmed. However, upon applying a voltage on the drain terminal, an undesirable depletion region outside the $N^+$-doped region 18 is also produced. Furthermore, hot holes ($e^+$) will be generated leading to hot hole injection in the presence of lateral electric field. These hot holes can severely affect the normal operation of a flash memory cell 10. With a short-circuiting connection between the $N^+$-doped region 18 of the drain terminal and the P-doped region 20, the above-mentioned problems can be prevented. Referring to FIG. 2, a metal contact 30 penetrates through an $N^+$-doped region 32 of each drain terminal and into a P-doped region 34. A bit line voltage $V_{BL}$ is applied to the $N^+$-doped region 32 of each drain terminal through the metal contact 30 so that the $N^+$-doped region 32 and the P-doped region 34 are short-circuited together.

In addition, a predetermined distance 38 between the metal contact 30 and the stacked gate 36 has to be maintained in the conventional flash memory cell for preventing interferences caused by each other. However, increasing cell density is constantly in demand in current market, and such conventional flash memory cell design apparently can not satisfy such demand.

SUMMARY OF INVENTION

It is therefore a primary objective of the present invention to provide a contactless channel write/erase flash memory cell by varying a connecting mode of a metal contact to increase memory packing density without affecting the source of a neighboring flash memory cell.

It is another object of the present invention to provide a method of fabricating a contactless channel write/erase flash memory cell.

According to the claimed invention, a flash memory array includes a plurality of contactless channel write/erase flash memory cells, and each memory cell includes a multi-level substrate, a first ion doped region, a floating gate, a tunnel oxide layer, a second ion doped region, a third ion doped region, a fourth ion doped region, two isolating oxide layers, a dielectric layer and a control gate. The tunnel oxide is located on the substrate, and the floating gate is located on the tunnel oxide layer, the first ion doped region acting as a drain is located on one side of the floating gate of the substrate, the second ion doped region is located surrounding a bottom of the first ion doped region, the third ion doped region is located beneath the floating gate with one side bordering on the second ion doped region, the fourth ion doped region that acts as a source is located in the substrate with one side bordering on the third ion doped region, the two isolating oxide layers are located on the first ion doped region and the fourth ion doped region respectively, the dielectric layer is located on the floating gate and the two isolating oxide layers, and the control gate is located above the floating gate and the two isolating oxide layers.

According to the present invention, the control gate of the flash memory cell extends laterally in a word line direction, and the first ion doped region and the second ion doped region extend in a bit line direction. Therefore, a metal contact which a bit line voltage applied to can be designed away from any of the first ion doped region and the second ion doped region of the memory cells in a bit line direction to decrease the number of the metal contact and also to reduce the area of the memory array.

The substrate, from bottom to top, includes a N-substrate, a deep P-well and a N-well. The first ion doped region and the fourth ion doped region are $N^+$-doped region formed by implanting phosphorous (P) or arsenic (As) ions, the second ion doped region and the third ion doped region are P-doped region formed by implanting boron (B) ions, and the second ion doped region has a depth much greater than the third ion doped region.

In addition, the first ion doped region and the second ion doped region are short-circuiting together, such as using a metal contact penetrating through junction between the first ion doped region and the second ion doped region, or using a metal contact crossing the exposed first ion doped region and the exposed second ion doped region.

Furthermore, the present invention further provides a fabricating method of a contactless channel write/erase flash memory cell. The flash memory cell is formed on a substrate. First, a shallow P-doped region is formed within the substrate, and then a tunnel oxide layer and a floating gate are formed on the shallow P-doped region, respectively. Next, a deep P-doped region is formed one side of the floating gate in the substrate, and two $N^+$-doped regions are formed on the deep P-doped region and another side of the floating gate within the substrate respectively. Two isolating oxide layers are formed on the two $N^+$-doped regions, and a dielectric layer is formed on the floating gate and the two $N^+$-doped regions. Finally, a control gate is formed on the dielectric layer.

The substrate includes a N-substrate, a deep P-well region and a N-well region. The N-substrate is formed first, and then the deep P-well region is formed on the N-substrate. Finally, an N-well region is formed on the deep P-well region.

At least one bit line metal contact is formed outside the block of the flash memory array. The metal contact penetrates through the isolating oxide layer and the junction between the N$^+$-doped region and the deep P-doped region. In an alternative method, the metal contact crosses the exposed N$^+$-doped region and the exposed deep P-doped region which short-circuits these two regions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
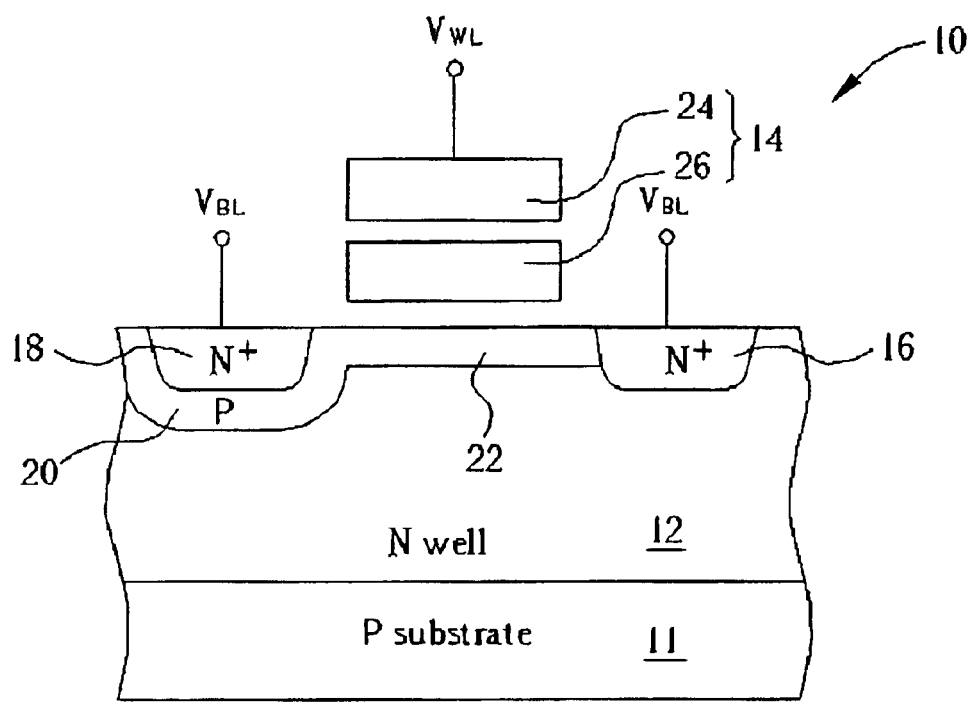
FIG. 1 is a cross-section view illustrating a conventional flash memory cell structure.
Figure 2:
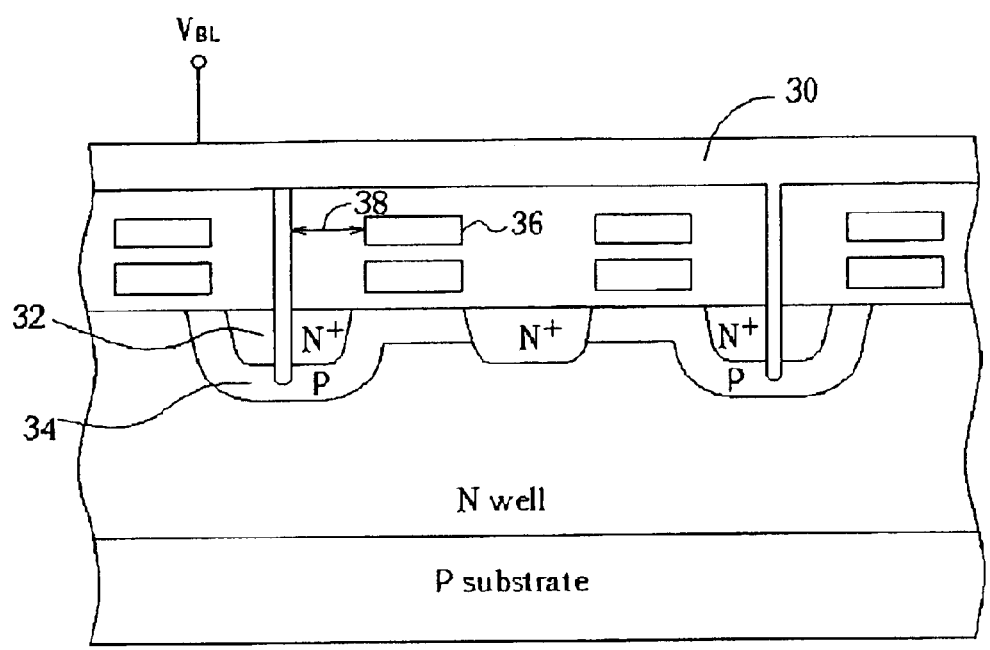
FIG. 2 is a cross-section view illustrating a metal contact structure associated with the conventional flash memory cell structure.
Figure 3:
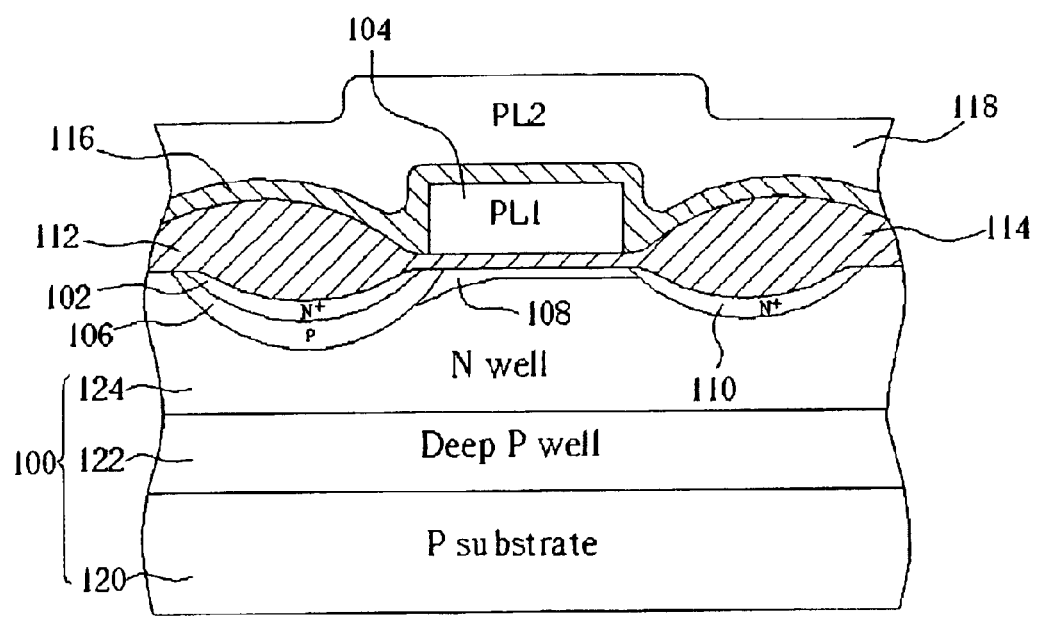
FIG. 3 is a cross-section view illustrating a write/erase flash memory cell structure according to the first embodiment of the present invention.

Referring to FIG. 3, FIG. 3 is a cross-sectional view illustrating a contactless channel write/erase flash memory cell according to the present invention. A flash memory array (not shown) is installed in a semiconductor wafer (not shown) having a plurality of flash memory cells arranged along a line direction. The line direction is a bit line direction or a word line direction perpendicularly to the bit line direction. Each cell includes a multi-level substrate 100, a first ion doped region 102, a tunnel oxide layer 103, a floating gate 104, a second ion doped region 106, a third ion doped region 108, a fourth ion doped region 110, two isolating oxide layers 112 and 114, a dielectric layer 116 and a control gate 118.

The multi-level substrate 100, from bottom to top, includes an N-substrate 120, a deep P-well 122 and an N-well 124. The first ion doped region 102, functioning as a drain, is formed by implanting N$^+$-type ions into the N-well 124 of the substrate 100. The tunnel oxide layer 103 locates between the floating gate 104 and the N-well 124 of the substrate 100, and the floating gate 104 locates on the tunnel oxide layer 103 next to the first ion doped region 102. The second ion doped region 106 is formed by implanting P-type ions into a bottom of the first ion doped region 102 and locates on the surrounding area of the first ion doped region 102. The third ion doped region 108 is formed by implanting P-ions into the N-well 124 and locates beneath the floating gate 104, with one side connected to the second ion doped region 106. The second ion doped region 106 has a depth much greater than the third ion doped region 108. The fourth ion doped region 110, that acts as a source of the flash memory cell, locates within the N-well 124 of the substrate 100, with one side connected to the third ion doped region 108. The two isolating oxide layers 112 and 114 locate on the first ion doped region 102 and the fourth ion doped region 110 respectively. The dielectric layer 116 locates on the floating gate 104 and the two isolating oxide layers 112 and 114, and the control gate 118 locates above the floating gate 104 and the two isolating layers 112 and 114.

Figure 4A:
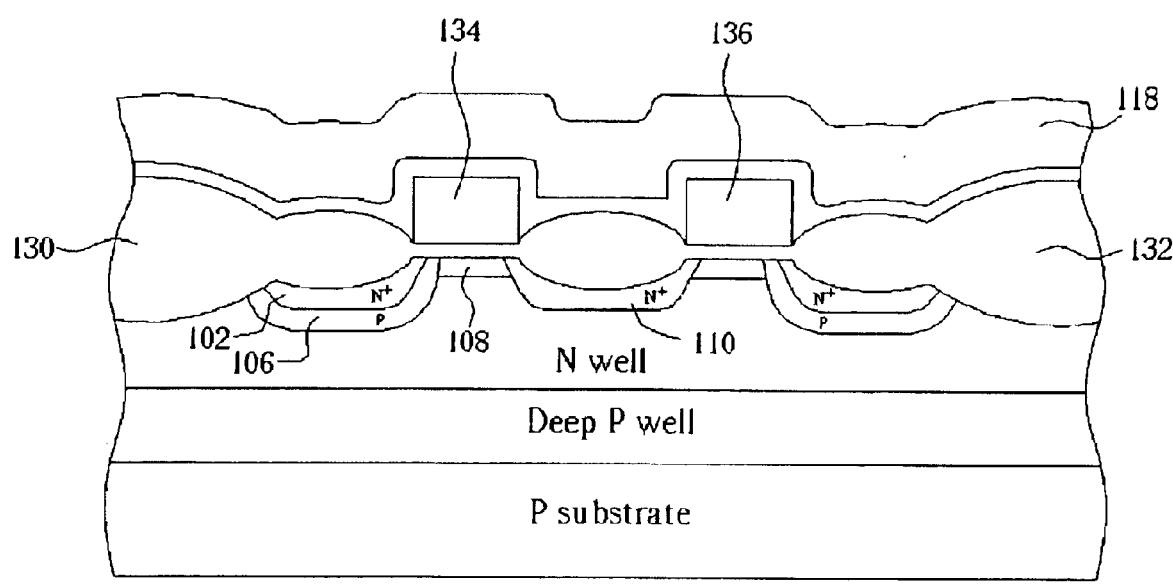
FIG. 4A is a cross-section view of the flash memory cell structure shown in FIG. 4B
Figure 4B:
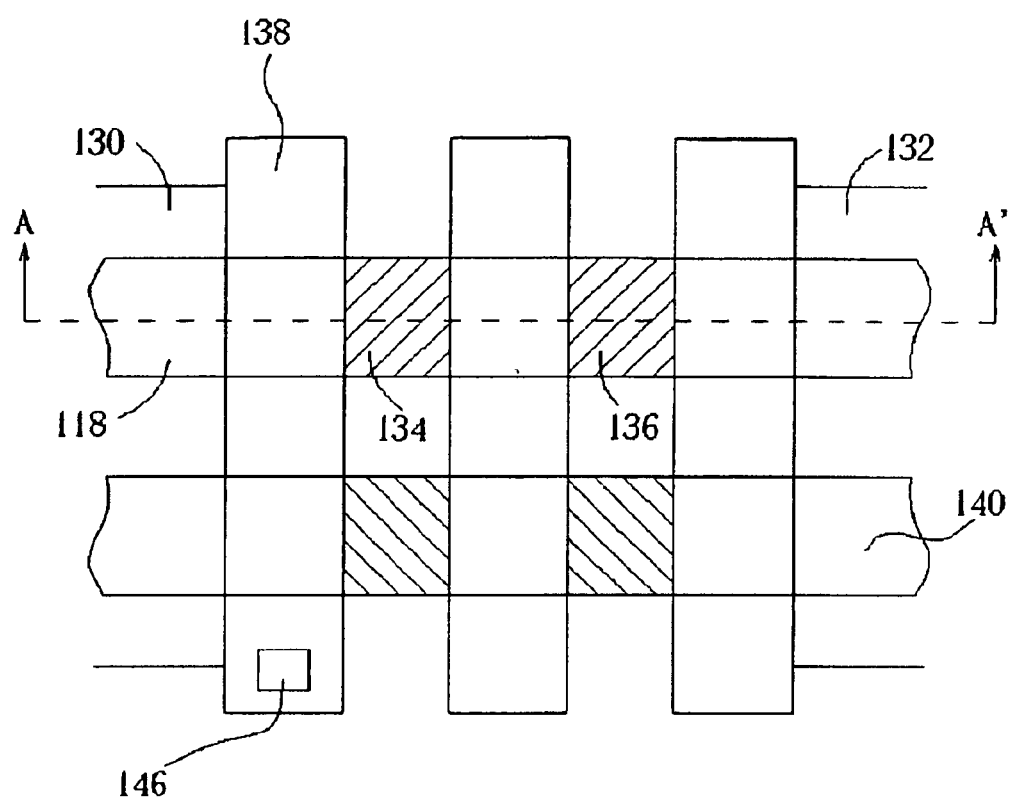
FIG. 4B is a top view of the write/erase flash memory cell structure according to the first embodiment of the present invention.

Referring to FIG. 4A and FIG. 4B, FIG. 4B is a top view of a contactless write/erase flash memory array according to the first embodiment of the present invention and FIG. 4A is a cross-section view of the flash memory array shown in FIG. 4B. The control gates 118, 140 extend to the word line direction and a word line voltage is applied to the control gate 118. The first ion doped region 102 and the second ion doped region 106 extend along the bit line direction, and adjacent first ion doped regions and adjacent second ion doped regions are connected with each other, respectively. A bit line voltage is applied to the first ion doped region 102 and the second ion doped region 106. The first ion doped region 102 and the second ion doped regional 106 are connected through only one metal contact (not shown), and the metal contact is installed in a via hole 146, shown in FIG. 4B, penetrating through junction between the first ion doped region 102 and the second ion doped region 106. The control gate 118 locates between the two field oxide layers 130 and 132, and the control gate 118 stretches over a plurality of floating gates, such as the floating gates 134 and 136. Furthermore, an overlapped portion 138 of the first ion doped region 102 and the second ion doped region 106 located one side of the floating gate 134 and beneath the control gate 118 extends along the bit line direction. Therefore, the bit line voltage is applied to the via hole 146 through the metal contact, and the metal contact is installed away from any of the first ion doped region 102 and the second ion doped region 106 of the memory cells to avoid electrical interference between the metal contact and the floating gate 118 of each of the memory cells.

Figure 5A:
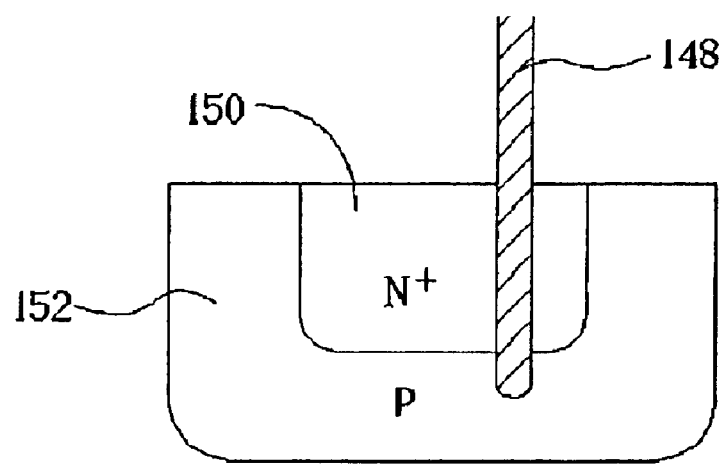
FIG. 5A is a cross-sectional view illustrating one type of metal contact structure associated with the write/erase flash memory cell structure according to the first embodiment of the present invention.
Figure 5B:
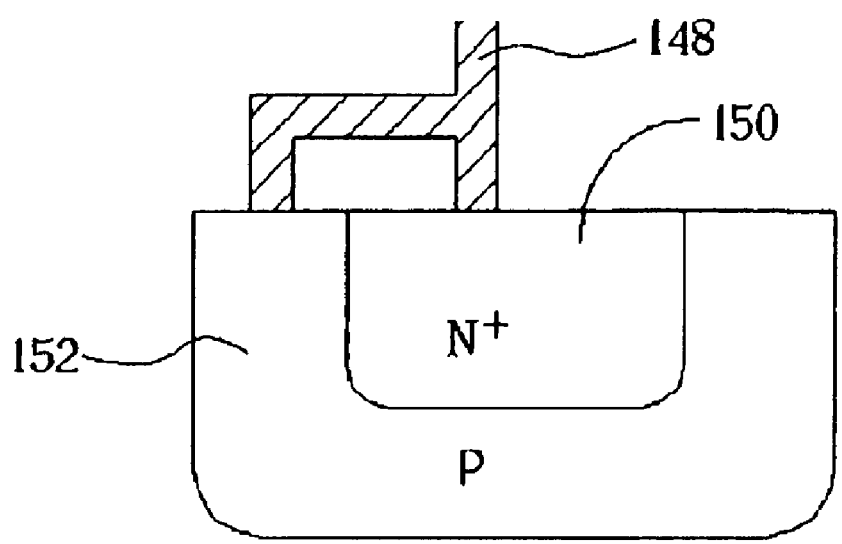
FIG. 5B is a cross-sectional view illustrating another type of metal contact structure associated with the write/erase flash memory cell structure according to the first embodiment of the present invention.

In addition, the first ion doped region 102 and the second ion doped region 106 are short-circuited together using a metal contact 148. Referring to FIG. 5A, FIG. 5A is a cross-sectional view illustrating metal contact structure associated with the write/erase flash memory cell structure according to the first embodiment of the present invention. The metal contact 148 penetrates through first ion doped region 150 and into second ion doped region 152 so that the two regions are short-circuited together. Referring to FIG. 5B, FIG. 5B is a cross-sectional view illustrating another type of metal contact structure associated with the write/ erase flash memory cell structure according to the present invention. Metal contact 148 is formed across the exposed first ion doped region 150 and the exposed second ion doped region 152 and thus short-circuits the two regions together.

Figure 6:
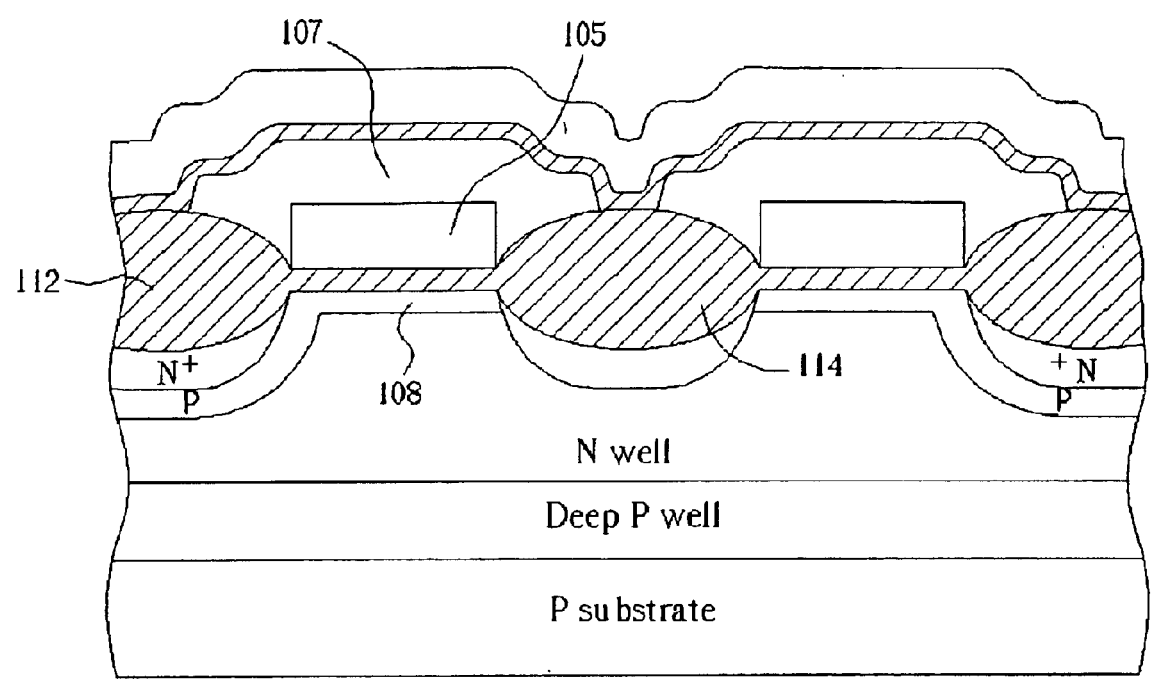
FIG. 6 is a cross-section view illustrating another write/erase flash memory cell structure according to the second embodiment of the present invention.

FIG. 6 is a cross-section view illustrating another contactless write/erase flash memory cell structure according to the second embodiment of the present invention. In this embodiment, the floating gate 104 shown in FIG. 3 is changed to a first floating gate 105 and a second floating gate 107. The first floating gate 105 locates on the third ion doped region 108 between the two isolating oxide layers 112 and 114, and the second floating gate 107 locates on the first floating gate 105 and a portion of the two isolating oxide layers 114 and 114. The first floating gate 105 and the second floating gate 107 are short-circuited. Since the overlapped area between the second floating gate 107 and the control gate is increased, the capacitance coupling effect is enhanced which increases the operating efficiency of the flash memory cell.

Figure 7A:
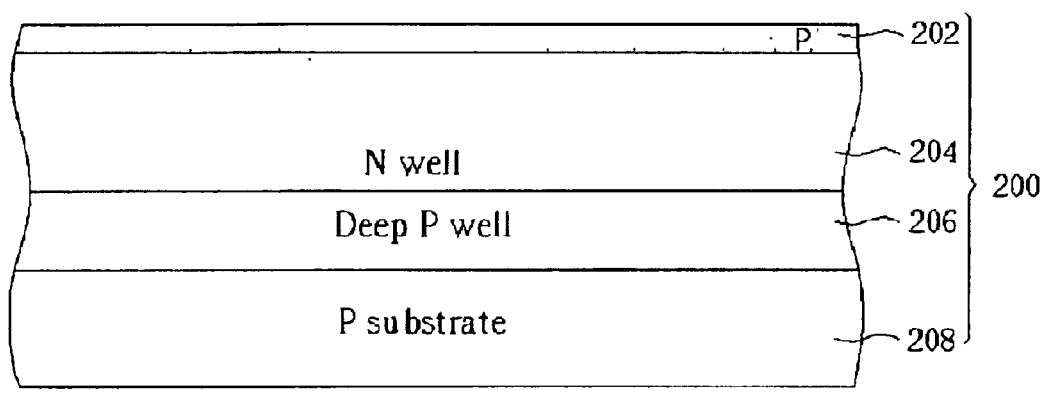
FIG. 7A through FIG. 7E are cross-section views illustrating the fabrication process of the write/erase flash memory cell structure according to the first embodiment of the present invention.
Figure 7B:
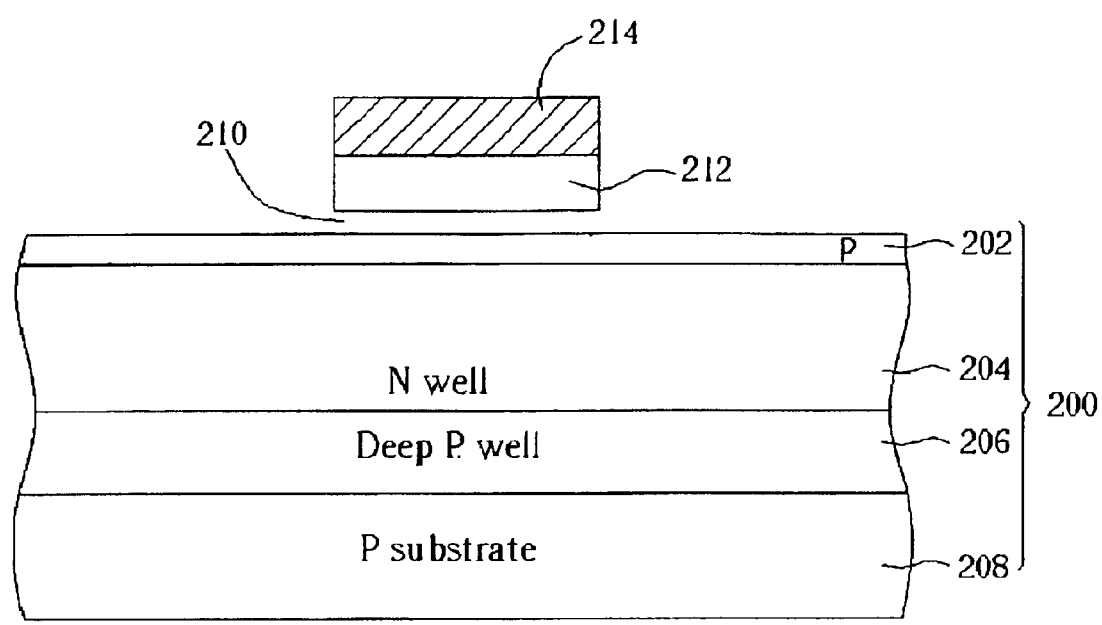

Furthermore, the present invention provides a fabricating method of a contactless channel write/erase flash memory cell. FIG. 7A through FIG. 7E are cross-section views illustrating the fabrication process of the write/erase flash memory cell structure according to the first embodiment of the present invention. Referring to FIG. 7A, a multi-level substrate 200, from bottom to top, including an N-substrate 208, a deep P-well 206 and an N-well 204, is formed. A shallow trench isolation (STI) or a field oxide layer (not shown) is formed on two sides of the substrate 200. And a P-doped region 202 is formed within the substrate 200 by implanting P-type ions into the substrate 200. Referring to FIG. 7B, a tunnel oxide layer 210 is formed on the substrate 200, and a first polysilicon layer 212 that acts as a floating gate and a silicon nitride layer 214 are deposited on the tunnel oxide layer 210. And a photolithographic and etching process is performed to form the structure shown in FIG. 7B.

Figure 7C:
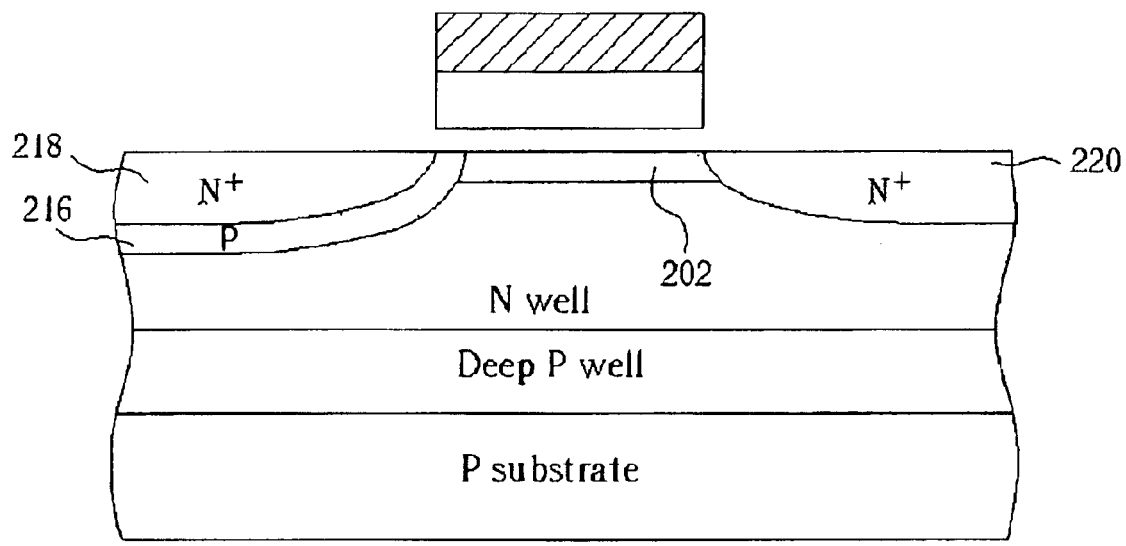
Figure 7D:
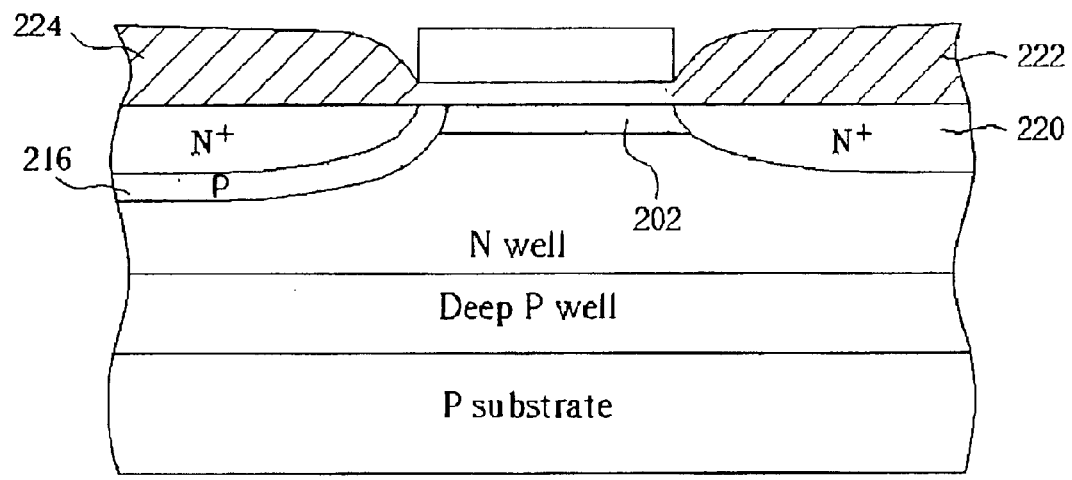
Figure 7E:
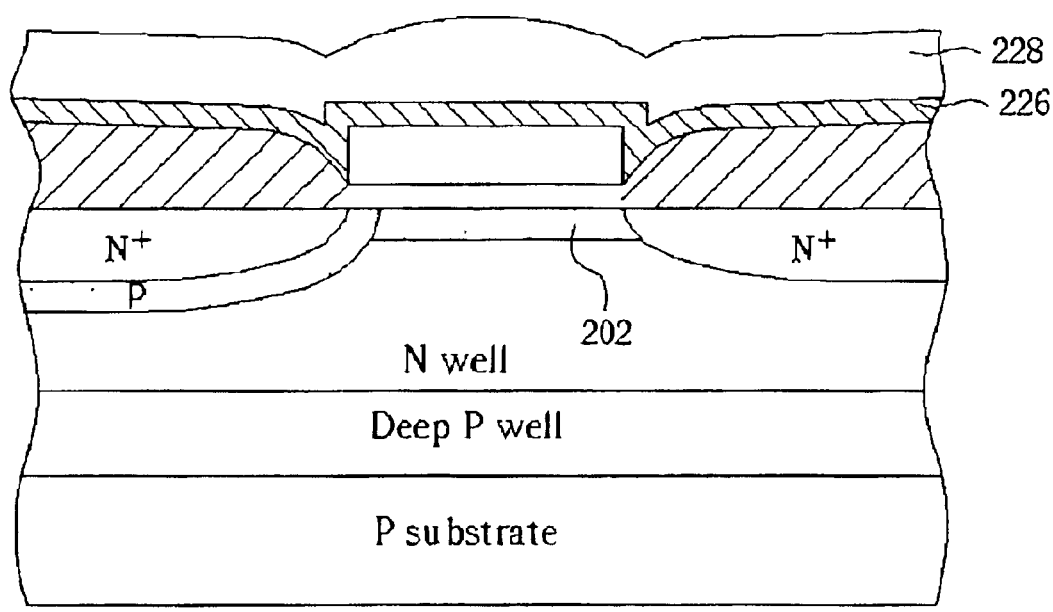

Referring to FIG. 7C, a P-doped region 216 is formed on one side of the first polysilicon layer 212 within the N-well 204 by using a P-type ion mask and P-type ions of fluoride boron ($BF_2$) into the N-well 204 of the substrate 200. And an $N^+$-doped region 218 and an $N^+$-doped region 220 are formed on the P-doped region 216 and another side of the first polysilicon layer 212 within the N-well 204, by implanting $N^+$-type ions, such as arsenic (As) into the N-well 204 of the substrate 200. Referring to FIG. 7D, two isolating oxide layers 222 and 224 are formed on the $N^+$-doped region 218 and the $N^+$-doped region 220, and the silicon nitride layer 214 on the first polysilicon layer 212 is removed. Finally referring to FIG. 7E, a dielectric layer 226 is deposited on the first polysilicon layer 212 and the two isolating oxide layers 222 and 224, and a second polysilicon layer 228 is deposited on the dielectric layer 226. Further, a stacked gate etching process is performed to remove portions of the first polysilicon layer 212 and the second polysilicon layer 228, and the second polysilicon layer 228 that acts as a word line is a long strip. Thereafter, a via hole is formed away from any of the $N^+$-doped region and the P-doped region of the flash memory cell as shown in FIG. 4B, and a bit line metal contact penetrates through the isolating oxide layers 222 and 224, and junction between the $N^+$-doped region 218 and the P-doped region 216, thereby short-circuiting the $N^+$-doped region 218 and into the P-doped region 216 together.

The operating method for operating the contact channel write/erase flash memory cell will be introduced below.

Figure 8A:
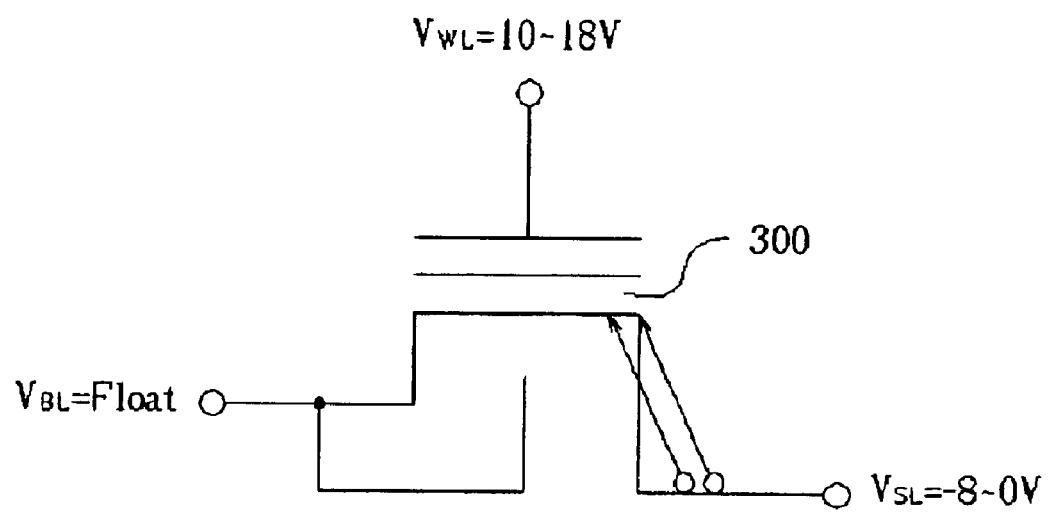
FIG. 8A through FIG. 8C are three circuit diagrams illustrating various modes of, operation of write/erase flash memory cell structure according to the first embodiment of the present invention.
Figure 8B:
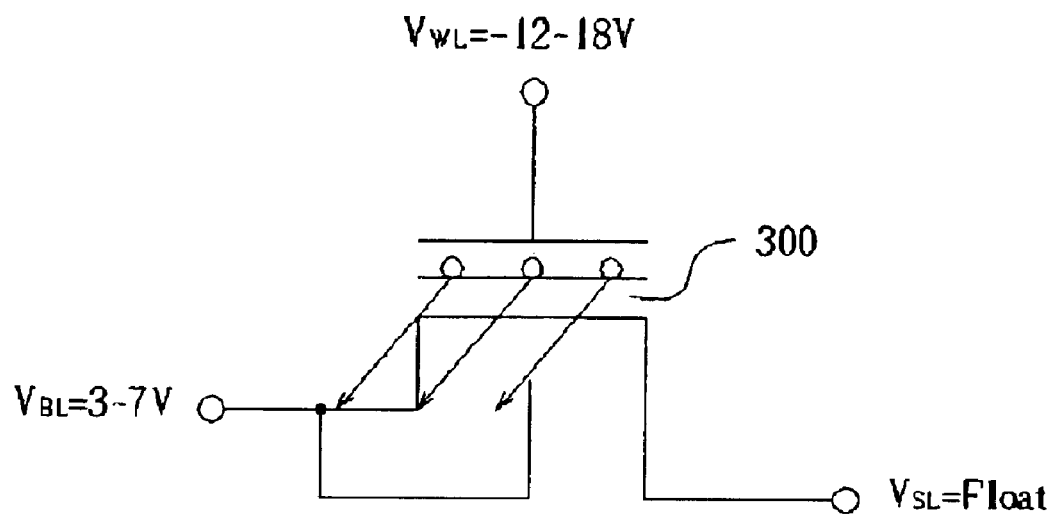
Figure 8C:
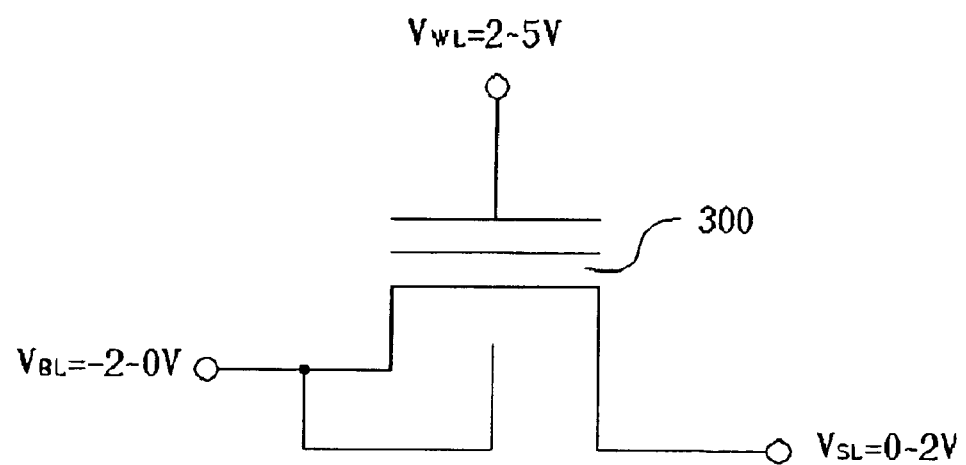

FIG. 8A through FIG. 8C are three circuit diagrams illustrating various modes of operations of the write/erase flash memory cell structure according to the first embodiment of the present invention. Referring to FIG. 8A through FIG. 8C, the Fowler-Nordheim tunneling effect is induced to program or erase the flash memory cell. A word line voltage $V_{WL}$, a source line voltage $V_{SL}$ and a bit line voltage $V_{BL}$ are applied to a control gate, a source terminal and a drain terminal of the flash memory cell 300 respectively. A P-doped region of the flash memory cell 300 and the bit line voltage are short-circuited together.

Referring to FIG. 8A, during an erasing operation of the flash memory cell 300, a high voltage is applied to the word line, such as $V_{WL}$=18 to 10 Volts, and a voltage lower than the word line voltage is applied to the source terminal, such as $V_{SL}$=0 to –8 Volts. Voltage of the bit line remains in afloating state. With such configuration, electrons of the source terminal are injected into the floating gate of the flash memory cell 300, thereby increasing a threshold voltage of the flash memory cell and achieving the necessary data-erase operation.

Referring to FIG. 8B, during a programming operation of the flash memory cell a low voltage is applied to the word line, such as $V_{WL}$=–12 to –8 Volts, and a voltage higher than the word line voltage is applied to the bit line, such as $V_{BL}$=6 to 9 Volts. Voltage of the source terminal $V_{SL}$ remains in afloating state. With such configuration, trapped floating gate electrons are injected away through a channel of the flash memory cell 300, thereby decreasing a threshold voltage of the flash memory cell and achieving the necessary programming operation.

Referring to FIG. 8C, during a reading data operation of the flash memory cell 300, a voltage is applied to the word line, such as $V_{WL}$=2 to 5 Volts, a voltage lower than the word line voltage is applied to the source terminal, such as $V_{SL}$=0 to 2 Volts, and a voltage lower than the source terminal is applied to the bit line, such as $V_{SL}$=–2 to 0 Volts. With such configuration, stored data can be read from the flash memory cell 300.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a contactless channel write/erase flash memory cell comprising:

providing a multi-level substrate;

forming a tunnel oxide layer on the multi-level substrate;

forming a shallow P ion region in said multi-level substrate;

forming a floating gate on said multi-level substrate;

forming a deep P ion region on one side of said floating gate in said multi-level substrate;

forming a first N ion doped region within said deep P ion region and a second N ion doped region on the other side of said floating gate in said multilevel substrate;

simultaneously forming a first isolating oxide layer on said first N ion doped region and a second isolating oxide layer on said second N ion doped region;

forming a dielectric layer on said floating gate, said first isolating oxide layer and second isolating oxide layer;

forming a control gate over said floating gate over said floating gate; and forming at least one bit line metal contact away from any of the N ion doped region and the deep P ion region of the memory cell wherein said metal contact penetrates through said isolating oxide layer and junction between said N ion doped region and said deep P ion resign.

2. The method of claim 1 wherein said multi-level substrate comprises:

an N substrate;

a deep P well region over said N substrate; and an N well region over said deep P well region.

3. The method of claim 1 wherein said metal contact further penetrates through said N ion doped region and into said deep P ion region.

4. The method of claim 1 further comprising forming a metal contact to electrically short-circuit the exposed surfaces of said first or second N ion doped region and said deep P ion region.

5. The method of claim 1 wherein said shallow P ion region and said deep P ion region are doped with boron.

6. The method of claim 1 wherein said first and second N ion doped regions are doped with phosphorus or arsenic.

* * * * *